(12) United States Patent
Moon et al.

(10) Patent No.: US 8,164,927 B2
(45) Date of Patent: Apr. 24, 2012

(54) SWITCH CONTROL DEVICE AND SWITCH CONTROL METHOD

(75) Inventors: Sang-Cheol Moon, Bucheon (KR); Young-Bae Park, Anyang (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 392 days.

(21) Appl. No.: 12/630,583

(22) Filed: Dec. 3, 2009

(65) Prior Publication Data

US 2010/0194463 A1 Aug. 5, 2010

(30) Foreign Application Priority Data

Feb. 5, 2009 (KR) .................. 10-2009-0009276

(51) Int. Cl.
*H02M 3/335* (2006.01)
*H02H 7/122* (2006.01)

(52) U.S. Cl. ................ 363/21.15; 363/21.17; 363/21.13; 363/56.1

(58) Field of Classification Search ................ 363/21.15, 363/21.17, 21.13, 131, 56.1
See application file for complete search history.

(56) References Cited

U.S. PATENT DOCUMENTS

| | | | |
|---|---|---|---|
| 4,933,829 A | 6/1990 | White | |
| 6,411,119 B1 | 6/2002 | Feldtkeller | |
| 6,611,439 B1 | 8/2003 | Yang et al. | |
| 6,665,197 B2 | 12/2003 | Gong et al. | |
| 6,674,656 B1 | 1/2004 | Yang et al. | |
| 6,781,357 B2 | 8/2004 | Balakrishnan et al. | |
| 7,099,163 B1 | 8/2006 | Ying | |
| 7,957,162 B2 * | 6/2011 | Choi et al. ................. | 363/21.13 |

* cited by examiner

*Primary Examiner* — Shawn Riley
(74) *Attorney, Agent, or Firm* — Okamoto & Benedicto LLP

(57) ABSTRACT

The present invention relates to a switch control device and a switch control method. The present invention controls a switching operation of a power switch that controls output power of a switching mode power supply (SMPS). The present invention generates an operation current corresponding to an input voltage of the SMPS and counts a compensation period in which a power supply voltage generated by the operation current increases from a predetermined counter low-reference voltage to a predetermined counter high-reference voltage. The present invention generates a compensation feedback current depending on the count result, generates a total feedback current by summing a main feedback current having a predetermined value and the compensation feedback current, and generates a power limit current of which a maximum value increases and decreases depending on the total feedback current. Turn-off of the power switch is determined by comparing the current flowing on the power switch with the power limit current.

20 Claims, 3 Drawing Sheets

US 8,164,927 B2

SWITCH CONTROL DEVICE AND SWITCH CONTROL METHOD

CROSS-REFERENCE TO RELATED APPLICATION

This application claims priority to and the benefit of Korean Patent Application No. 10-2009-0009276 filed in the Korean Intellectual Property Office on Feb. 5, 2009, the entire contents of which are incorporated herein by reference.

BACKGROUND OF THE INVENTION (a) Field of the Invention

The present invention relates to a switch control device for constantly controlling a maximum output power of a switching mode power supply (hereinafter referred to as "SMPS").

(b) Description of the Related Art

Output efficiency of an SMPS varies depending on an input voltage. Assuming that the SMPS supplies a constant output power to a load, as the input voltage of the SMPS is reduced, a larger input current is required such that a duty of a switch of the SMPS increases. As a result, conduction loss of the switch increases, such that the output efficiency of the SMPS decreases. In addition, in general, a maximum value of a drain current of the SMPS is set to a predetermined threshold value or less regardless of the input voltage.

In this case, a maximum output power of the SMPS varies depending on the input voltage. The output power is determined depending on the drain current, input voltage, and output efficiency of the SMPS. In an overload state, the switch is driven at a maximum duty, such that a maximum value of the drain current is maintained at a threshold value. Therefore, as the input voltage is increased, the output power increases. That is, the maximum output power of the SMPS varies depending on the input voltage. As a result, when the SMPS is subjected to a high input voltage and an overload, the SMPS is under severe stress.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a switch control device and a switch control method of an SMPS that constantly maintain a maximum output power regardless of an input voltage of the SMPS.

An exemplary embodiment of the present invention provides a switch control device that controls a switching operation of a power switch for controlling an output power of a switching mode power supply (SMPS) and includes: an operation current source that generates an operation current corresponding to an input voltage of the SMPS; and a maximum output power control unit that counts a compensation period in which a power supply voltage generated by the operation current increases from a predetermined counter low-reference voltage to a predetermined counter high-reference voltage, generates a compensation feedback current depending on the counter result, generates a total feedback current by summing a main feedback current having a predetermined value and the compensation feedback current, and generates a power limit current of which a maximum value increases and decreases depending on the total feedback current. At this time, turn-off of the power switch is determined by comparing a current flowing on the power switch with the power limit current. The maximum output power control unit includes a power limit compensator that counts the compensation period and generates and outputs the compensation feedback current depending on the count result, and a feedback current source that generates the main feedback current, wherein the power limit current is determined depending on a feedback signal corresponding to an output voltage of the SMPS among the total feedback current, and the power limit current includes the total feedback current in an overload state of the SMPS. The power limit compensator includes at least one compensation current source that generates at least one compensation current, at least one switch that is connected between the least one compensation current source and the feedback current source, and a counter that counts the compensation period and control a switching operation of the at least one switch depending on the count result. The counter includes a first comparator that compares the counter high-reference voltage with the power supply voltage, a second comparator that compares the counter low-reference voltage with the power supply voltage, an arithmetic logic unit that receives and logically operates comparison results of the first comparator and the second comparator and outputs an enable signal depending on the logic operation results, and at least one counter flip-flop that is enabled depending on the enable signal, and inverts and outputs an output signal and an inverted output signal at one cycle of an input signal, wherein the enable signal corresponds to the compensation period and the output signal of the at least one counter flip-flop is a switching control signal of the at least one switch. The first comparator includes a non-inversion terminal that receives the power supply voltage and an inversion terminal that receives the counter high-reference voltage, the second comparator includes an inversion terminal that receives the power supply voltage and a non-inversion terminal that receives the counter low-reference voltage, and the arithmetic logic unit is a NOR gate. The number of the at least one compensation current source is the same as the number of the at least one switch, and the number of the at least one counter flip-flop is determined depending on the number of the at least one switch. The number of the at least one compensation current source or the number of the at least one switch is n, and the at least one counter flip-flop includes n counter flip-flops corresponding to n switches, respectively. An inverted output signal of a k-th (where k is a natural number of 1 to n−1) counter flip-flop among the n counter flip-flops is an input signal of a (k+1)-th counter flip-flop and an output signal of the k-th counter flip-flop is a switching control signal of a k-th switch among the n switches. An output signal of the (k+1)-th counter flip-flop is a switching control signal of a (k+1)-th switch among the n switches. The at least one counter flip-flop includes a counter flip-flop that receives a counter clock signal having a predetermined cycle as the input signal, wherein digital data realized by the output signal of the at least one counter flip-flop increase at one cycle of the counter clock signal. The maximum output power control unit further includes a first diode that receives the feedback signal through a cathode electrode thereof and is connected to the feedback current source and an output terminal of the power limit compensator, a second diode of which an anode electrode is connected to the feedback current source and the output terminal of the power limit compensator, a first resistor of which one side is connected to a cathode electrode of the second diode, and a second resistor of which one side is connected to the other side of the first resistor and the other side is grounded, wherein the feedback signal increases when an output voltage of the SMPS decreases and decreases when the output voltage of the SMPS increases, and the power limit current flows through the second diode. The switch control device further includes a PWM control unit that determines a turn-off time of the power switch by comparing a sensing voltage corresponding to the current flowing on the power switch with a drain current control voltage that is generated by allowing the power limit current on the second resistor. The PWM control unit turns off the power switch when the sensing voltage reaches the drain current control voltage. The switch control device further includes a switch that charges a capacitor by using the operation current source to generate the power supply voltage and is positioned between the capacitor and the operation current source, wherein when the power supply voltage is equal to or more than a high reference voltage that is larger than an operation threshold voltage required to operate the switch control device by a predetermined margin in an initial operation, the switch is turned off. The switch control device further includes a hysteresis comparator that compares the power supply voltage with the high reference voltage and a low reference voltage that is lower than the high reference voltage and controls the switching operation of the switch depending on the comparison result, wherein the hysteresis comparator turns on the switch when the power supply voltage is smaller than the low reference voltage and maintains the present switch state when the power supply voltage is between the low reference voltage and the high reference voltage.

Another embodiment of the present invention provides a switch control method of controlling a switching operation of a power switch that controls an output power of a switching mode power supply (SMPS), which includes the steps of: generating an operation current corresponding to an input voltage of the SMPS; counting a compensation period in which a power supply voltage generated by the operation current increases from a predetermined counter low-reference voltage to a predetermined counter high-reference voltage; generating a compensation feedback current depending on the count result in the counting step; generating a total feedback current by summing a main feedback current having a predetermined value and the compensation feedback current; and determining turn-off of the power switch by comparing the current flowing on the power switch with a power limit current of which a maximum value is determined depending on the total feedback current. The switch control method further includes the step of determining the power limit current depending on a feedback signal corresponding to an output voltage of the SMPS among the total feedback current, wherein the power limit current includes the total feedback current in an overload state of the SMPS. In the step of determining the power limit current, the power limit current increases when the feedback signal increases and the power limit current decreases when the feedback signal decreases, and the feedback signal increases when the output voltage of the SMPS decreases and decreases when the output voltage of the SMPS increases. The step of generating the compensation feedback current includes the step of counting the compensation period, and increasing the compensation feedback current depending on the count result. The switch control method further includes the step of generating a power supply voltage by charging a capacitor by using the operation current source and stopping charging of the capacitor when the power supply voltage is equal to or larger than a high reference voltage that is larger than an operation threshold voltage that is required to operate the switch control device in an initial operation.

According to the present invention, there are provided a switch control device and a switch control method of an SMPS that supply a constant maximum output regardless of an input voltage.

DETAILED DESCRIPTION OF THE EMBODIMENTS

Figure 1:
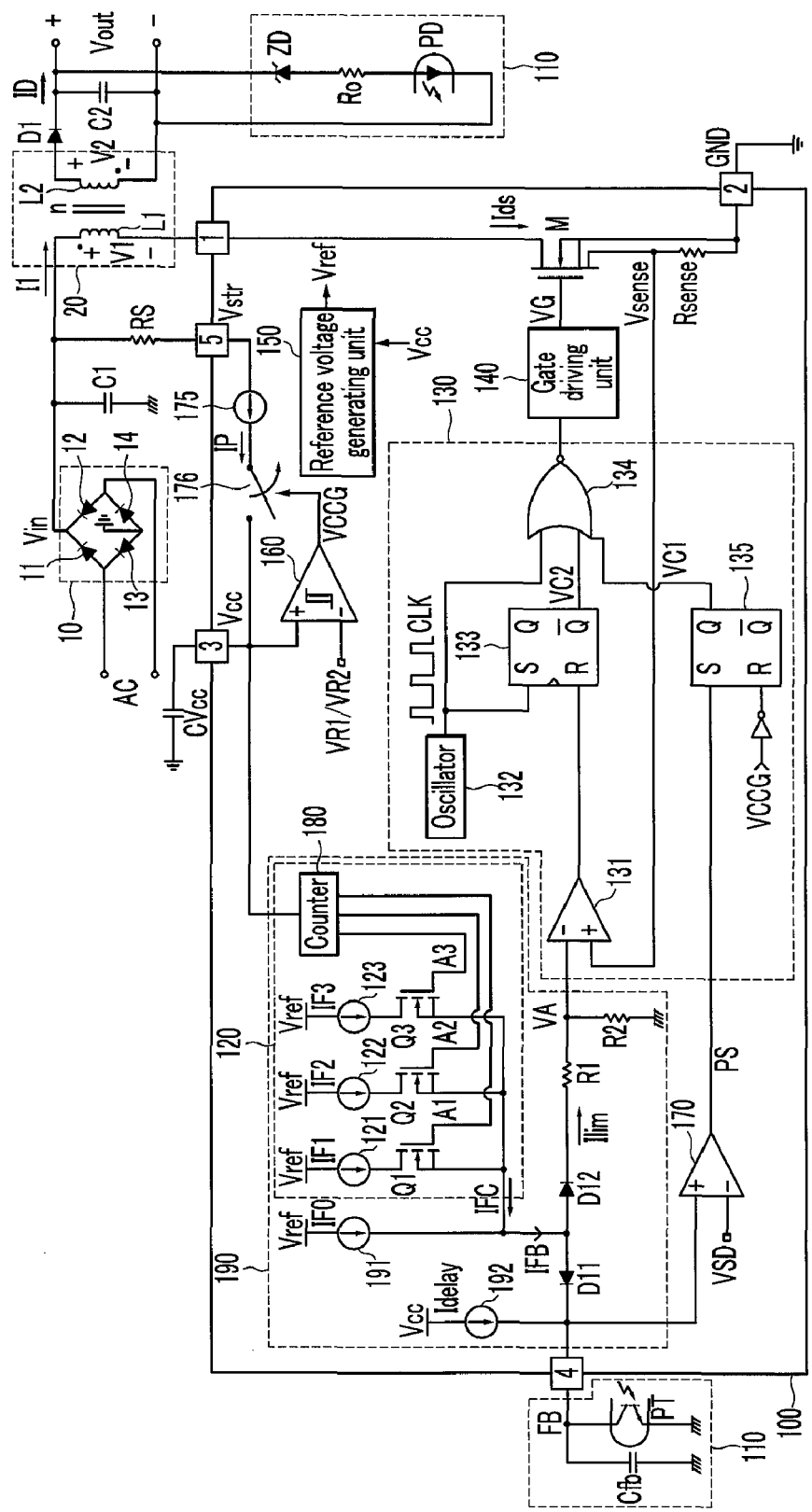
FIG. 1 is a diagram illustrating a switch control device and an SMPS including the same according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereinafter, a switch control device and an SMPS including the same according to an exemplary embodiment of the present invention will be described in detail with reference to the accompanying drawings.

FIG. 1 is a diagram illustrating a switch control device and an SMPS including the same according to an exemplary embodiment of the present invention. The SMPS according to the exemplary embodiment of the present invention is realized as a fly-back converter type. However, the present invention is not limited thereto, and may use converters of different types.

As shown in FIG. 1, the SMPS according to the exemplary embodiment of the present invention includes a bridge diode 10, a transformer 20, a feedback circuit part 110, and a switch control device 100.

In the exemplary embodiment of the present invention, the switch control device 100 includes a power switch M, but the present invention is not limited thereto. The power switch M and the switch control device 100 are separated from each other, such that the power switch M and the switch control device 100 may be realized as separate chips. The power switch M according to the exemplary embodiment of the present invention is an n-channel type of transistor, and a source electrode of the power switch M is grounded through a connection terminal 2. A sensing resistor Rsense is connected between the source electrode of the power switch M and a ground. A current corresponding to a predetermined ratio of a drain current Ids flowing on the power switch M flows on the sensing resistor Rsense.

The bridge diode 10 is constituted by four diodes 11 to 14, and full-wave rectifies an input alternating current power AC to generate an input voltage Vin. A capacitor C1 smoothes the input voltage Vin and supplies the smoothed input voltage Vin to the transformer 20. Hereinafter, the smoothed input voltage Vin is briefly referred to as the input voltage Vin. The input voltage Vin is supplied to the switch control device 100 through a resistor RS. A voltage supplied through a connection terminal 5 of the switch control device is a start voltage Vstr, and a power supply voltage Vcc required to operate the switch control device 100 is generated by the start voltage Vstr.

The transformer 20 includes a primary coil L1 and a secondary coil L2. The input voltage Vin is supplied to one side of the primary coil L1, and the other side of the primary coil L1 is connected to a drain electrode of the power switch M through the connection terminal 1. One side of the secondary coil L2 is connected to an anode electrode of a diode D1 and the other side of the secondary coil L2 is connected to one side of a capacitor C2. The other side of the capacitor C2 is connected to a cathode electrode of a diode D1. A voltage between both sides of the capacitor C2 serves as an output voltage Vout. A turn ratio n is acquired by dividing a turn ratio of the primary coil L1 by a turn ratio of the secondary coil L2. A voltage V2 is acquired by dividing a voltage V1 by the turn ratio, and the polarity of the voltage V2 is opposite to the polarity of the voltage V1.

When the power switch M is turned on, the voltage V1 between both sides of the primary coil L1 serves as the input voltage Vin and a current I1 flowing on the primary coil L1 increases. The current I1 increases at a slope that is proportional to the input voltage Vin. A drain current Ids is equal to a current I1 while the power switch M is turned on.

When the power switch M is turned off, the voltage V1 of the primary coil L1 is a voltage acquired by multiplying the output voltage Vout by the turn ratio n, and becomes a negative voltage. Meanwhile, the voltage V2 becomes a positive voltage. The current I1 decreases at a slope that is proportional to the output voltage Vout. At this time, the drain current Ids is 0. The diode D1 rectifies the current flowing on the secondary coil L2 and generates a current ID. The current ID charges the capacitor C2 or flows on a load connected to the SMPS. The capacitor C2 is charged by the current ID. When the diode D1 is turned off, the capacitor C2 supplies a necessary power to the load.

The feedback circuit part 110 includes a zener diode ZD, a resistor Ro, an opto-diode PD, an opto-transistor PT, and a feedback capacitor Cfb. The feedback circuit part 110 generates feedback information FB corresponding to the output voltage Vout, and transmits the feedback information FB to the switch control device 100. The output voltage Vout is applied to a cathode electrode of the zener diode ZD. An anode electrode of the zener diode ZD is connected to one side of the resistor Ro. The other side of the resistor Ro is connected to one side of the opto-diode PD. When a cathode electrode voltage is higher than an anode electrode voltage by a break voltage or more, the zener diode ZD is electrically conducted and the current flows on the zener diode ZD. A voltage difference between the cathode electrode and the anode electrode of the zener diode ZD is maintained to the break voltage. When the zener diode ZD is electrically conducted by the output voltage Vout, a current of a magnitude corresponding to the output voltage Vout flows through the zener diode ZD, the resistor Ro, and the opto-diode PD. The opto-diode PD emits light depending on the flowing current.

In the case of the opto-transistor PT that constitutes an opto-coupler together with the opto-diode PD, a current corresponding to brightness of the opto-diode PD flows on the opto-transistor PT. As the current of the opto-transistor PT increases, the feedback capacitor Cfb is discharged and a voltage of the feedback signal FB decreases. On the contrary, as the current flowing on the opto-transistor PT decreases, a current supplied to the feedback capacitor Cfb increases, such that the voltage of the feedback signal FB increases. Accordingly, as the load increases, the output voltage Vout decreases, such that a current of the opto-transistor PT decreases and the voltage of the feedback signal FB increases.

The switch control device 100 compares the drain current Ids flowing on the power switch M with the feedback information FB to control a turn-off time of the power switch M. The switch control device 100 according to the exemplary embodiment of the present invention controls a switching operation by using a current limit Hlim that varies depending on the input voltage as well as the feedback information to thereby constantly maintain maximum output power of the SMPS regardless of the input voltage.

Now, a configuration of the switch control device 100 will be described.

The switch control device 100 includes a PWM control unit 130, a gate driving unit 140, a reference voltage generating unit 150, a hysteresis comparator 160, a protection comparator 170, an operation current source 175, and a maximum output power control unit 190.

The operation current source 175 is connected to the resistor RS through the connection terminal 5, and generates an operation current IP by using the start voltage Vstr that varies depending on the input voltage Vin. The operation current IP charges a capacitor CVcc to generate the power supply voltage Vcc. The power supply voltage Vcc is a voltage required to operate the switch control device 100. The operation current source 175 includes a junction field effect transistor (JFET). The start voltage Vstr is applied to the JFET, such that the operation current IP corresponding to the start voltage Vstr is generated. Since the magnitude of the operation current IP varies depending on the start voltage Vstr, the magnitude of the operation current IP resultantly varies depending on the input voltage Vin. A switch 176 is connected to one side of the operation current source 175, and the switching operation of the switch 176 is controlled by a power supply sensing signal VCCG. When the switch 176 is turned off, the operation current IP is interrupted. When the switch 176 is turned on, the power supply capacitor CVcc is charged by the operation current IP to thereby increase the power supply voltage Vcc. When the power supply voltage Vcc is equal to or larger than a predetermined operation threshold voltage, the switch 176 is turned off, and when the power supply voltage Vcc is smaller than the operation threshold voltage, the switch 176 is turned on. The operation threshold voltage is a minimum voltage required to normally operate the switch control device 100. The switch 176 is turned off by a high-level power supply voltage sensing signal VCCG and is turned on by a low-level power supply voltage sensing signal VCCG. The hysteresis comparator 160 compares a low reference voltage VR1 and a high reference voltage VR2 with the power supply voltage Vcc, and generates the power supply voltage sensing signal VCCG depending on the comparison result. When the power supply voltage Vcc is equal to or larger than the high reference voltage VR2, the hysteresis comparator 160 generates the high-level power supply voltage sensing signal VCCG. When the power supply voltage Vcc is smaller than the low reference voltage VR1, the hysteresis comparator 160 generates the low-level power supply voltage sensing signal.

When the power supply voltage Vcc is a voltage between the high reference voltage VR2 and the low reference voltage VR1, the hysteresis comparator 160 maintains the power supply voltage sensing signal VCCG that is presently outputted. The low reference voltage VR1 may be set to the operation threshold voltage and the high reference voltage VR2 may be set to a voltage that is higher than the operation threshold voltage by a predetermined margin.

The reference voltage generating unit 150 generates a reference voltage Vref by using the power supply voltage Vcc. The reference voltage Vref is supplied to the maximum output power control unit 190.

The PWM control unit 130 includes a comparator 131, an oscillator 132, a PWM flip-flop 133, a PWM logic unit 134, and a protection flip-flop 135. The PWM control unit 130 compares a drain current control voltage VA with a sensing voltage Vsense to control the drain current of the power switch M. The oscillator 132 generates a clock signal CLK of a predetermined cycle. The power switch M is turned on in synchronization with a falling edge time of the clock signal CLK. Accordingly, the frequency of the clock signal CLK is the same as the switching frequency of the power switch M.

The PWM logic unit 134 receives the clock signal CLK and two gate control signals VC1 and VC2. The PWM logic unit 134 outputs a low-level signal when at least one of the inputted signals is at a high level and a high-level signal when all inputted signals are at a low level.

The protection flip-flop 135 receives a protection signal PS and controls the gate driving unit 140 to turn off the power switch M depending on the protection signal PS. The protection signal PS, which is a signal having the high level when the voltage of the feedback signal FB is higher than a protection reference voltage VDS, is generated when an overload state is maintained during a predetermined period. The predetermined period is the same as a period after a diode D11 is interrupted, and the voltage of the feedback signal FB reaches the protection reference voltage VSD by a delay current Idelay. When a high-level protection signal PS is inputted into a set terminal of the protection flip-flop 135, the protection flip-flop 135 generates a high-level gate control signal VC1 and transmits the high-level the gate control signal VC1 to the PWM logic unit 134. In this case, the PWM logic unit 134 generates the low-level signal regardless of other input signals and transmits the low-level signal to the gate driving unit 140.

The PWM flip-flop 133 determines a gate control signal VC2 depending on signals inputted into a set terminal S and a reset terminal R. The PWM flip-flop 133 outputs a low-level gate control signal VC2 when the high-level signal is inputted into the set terminal S and the low-level signal is inputted into the reset terminal R. The PWM flip-flop 133 outputs a high-level gate control signal VC2 when the high-level signal is inputted into the reset terminal R and the low-level signal is inputted into the set terminal S. The PWM flip-flop 133 maintains the present gate control signal VC2 when the low-level signal is inputted into the set terminal S and the reset terminal R.

The gate driving unit 140 outputs a low-level gate signal VG to turn off the power switch M in response to a low-level output signal of the PWM logic unit 134, and outputs a high-level gate signal VG to turn on the power switch M in response to the high-level output signal of the PWM logic unit 134.

The PWM comparator 131 outputs the high-level signal to the reset terminal R of the PWM flip-flop 133 when the sensing voltage Vsense reaches the drain current control voltage VA. In this case, the PWM flip-flop 133 generates a high-level gate control signal VC2 and transmits the high-level gate control signal VC2 to the PWM logic unit 134. In this case, the PWM logic unit 134 generates the low-level signal regardless of other input signals and transmits the low-level signal to the gate driving unit 140. The drain current control voltage VA will be described below.

The clock signal CLK of the oscillator 132 is inputted into the set terminal S of the PWM flip-flop 133 and the PWM logic unit 134. The PWM flip-flop 133 generates a low-level gate control signal VC2 at the time when the clock signal CLK increases and generates the high-level gate control signal VC2 when an output signal of the comparator 131 is at the high level at the time when the sensing voltage Vsense increases and reaches the drain current control voltage VA while the clock signal CLK is at the low level. Thereafter, the PWM flip-flop 133 outputs the low-level gate control signal VC2 at the time when the clock signal CLK increases.

The maximum output power control unit 190 includes a power limit compensator 120, a feedback current source 191, a delay current source 192, diodes D11 and D12, and resistors R11 and R12. The feedback current source 191 is biased by the reference voltage Vref and the delay current source 192 is biased by the power supply voltage Vcc. Anode electrodes of the diode D11 and the diode D12 are connected to output terminals of the feedback current source 191 and the power limit compensator 120, respectively. A cathode electrode of the diode D11 is connected to the feedback circuit part 110 and the delay current source 192 through the connection terminal 4. A cathode electrode of the diode D12 is connected to one side of the resistor R1. The other side of the resistor R1 is connected to one side of the resistor R2 and an inversion terminal (−) of the PWM comparator 131 of the PWM control unit 130. The other side of the resistor R2 is grounded. The drain current control voltage VA of a contact point between the resistor R1 and the resistor R2 is determined by the power limit current Ilim. The feedback current source 191 supplies a main feedback current IF0 and the delay current source 192 supplies a delay current Idelay. A total feedback current IFB is a current acquired by summing the main feedback current IF0 and a compensation feedback current IFC. All of the delay current Idelay is supplied to the feedback capacitor Cfb, but the delay current Idelay is still smaller than the current flowing on the opto-transistor PT when the SMPS is normally operated, such that a charging amount in the feedback capacitor Cfb is insufficient. The delay current Idelay is a current for increasing the feedback signal FB in the case in which all the total feedback current IFB flows through the diode D12 when the SMPS is subjected to the overload state. When the feedback signal FB is increased by the delay current Idelay and reaches the protection reference voltage VSD, the switch control device 100 compulsorily stops the switching operation of the power switch M in order to protect the SMPS. An amount of a current flowing through the diode D11 among the total feedback current IFB varies depending on the feedback signal FB. Therefore, the power limit current Ilim that flows through the diode D12 also varies depending on the feedback signal FB. However, in the overload state, the power limit current Ilim becomes the total feedback current IFB, which is a maximum value. The maximum output power is determined depending on a maximum current that may flow on the power switch M and the maximum current that may flow on the power switch M is determined by the drain current control voltage VA, such that the maximum output power is determined by the drain current control voltage VA. The drain current control voltage VA is determined by the power limit current Ilim, such that the maximum output power is determined by the power limit current Ilim.

The power limit compensator 120 generates the compensation feedback current IFC as a time during a period when the power supply voltage Vcc is increased by the operation current IP elapses. More specifically, as a time during a compensation period when the power supply voltage Vcc increases from a predetermined voltage (hereinafter referred to as "counter low-reference voltage") to a predetermined voltage (hereinafter referred to as "counter high-reference voltage") elapses, the compensation feedback current IFC increases. As the operation current IP decreases, the speed to increase the power supply voltage Vcc by charging the capacitor CVcc is slow. Accordingly, a period during which the power supply voltage Vcc increases to the counter high-reference voltage by the operation current IP is extended. Therefore, as the operation current IP decreases, the compensation feedback current IFC increases. At this time, a magnitude of the operation current IP is determined depending on the input voltage Vin, such that as the input voltage Vin decreases, the compensation feedback current IFC increases, and as the input voltage Vin increases, the compensation feedback current IFC decreases.

The power limit compensator 120 includes a plurality of compensation current sources 121 to 123, switches Q1 to Q3 connected to the plurality of compensation current sources 121 to 123, and a counter 180. The power limit compensator 120 according to the exemplary embodiment of the present invention includes the three compensation current sources 121 to 123, but the present invention is not limited thereto. The number of compensation current sources and current magnitudes of the compensation current sources may vary depending on the magnitude of the compensation feedback current IFC. The counter 180 receives the power supply voltage Vcc and determines a final magnitude of the compensation feedback current IFC within a compensation period. The compensation period varies depending on the input voltage Vin. More specifically, as the input voltage Vin increases, the compensation period decreases, and as the input voltage Vin decreases, the compensation period increases. The counter 180 counts the compensation period and generates a plurality of switching control signals A1 to A3 depending on the counting result. The plurality of switching control signals A1 to A3 control switching operations of a plurality of switches Q1 to Q3, respectively. When the plurality of switches Q1 to Q3 are turned on, compensation currents IF1 to IF3 of the plurality of corresponding compensation current sources 121 to 123 flow on the switches that are turned on. In the exemplary embodiment of the present invention, magnitudes of the compensation currents IF1 to IF3 of the plurality of corresponding compensation current sources 121 to 123 are set to IF1<IF2<IF3. The present invention is not limited thereto, but the magnitudes of the compensation currents IF1 to IF3 are determined depending on the turn-on order of the switches Q1 to Q3. That is, the compensation current of the compensation current source connected to the switch that is firstly turned on has the smallest magnitude, and the later the turn-on order of the switch, the greater the magnitude of the compensation current of the compensation current source connected to the corresponding switch. The compensation feedback current IFC is determined by summing the compensation currents IF1 to IF3. The counter 180 determines the compensation feedback current IFC depending on an increase slope of the power supply voltage Vcc at the time of initial start of the SMPS. The increase slope of the power voltage Vcc is determined depending on the operation current IP, and the operation current IP is determined depending on the input voltage Vin. Accordingly, the switch control device 100 according to the exemplary embodiment of the present invention determines the compensation feedback current IFC depending on the input voltage Vin.

Hereinafter, referring to FIGS. 2 and 3, a configuration and an operation of the counter 180 will be described.

Figure 2:
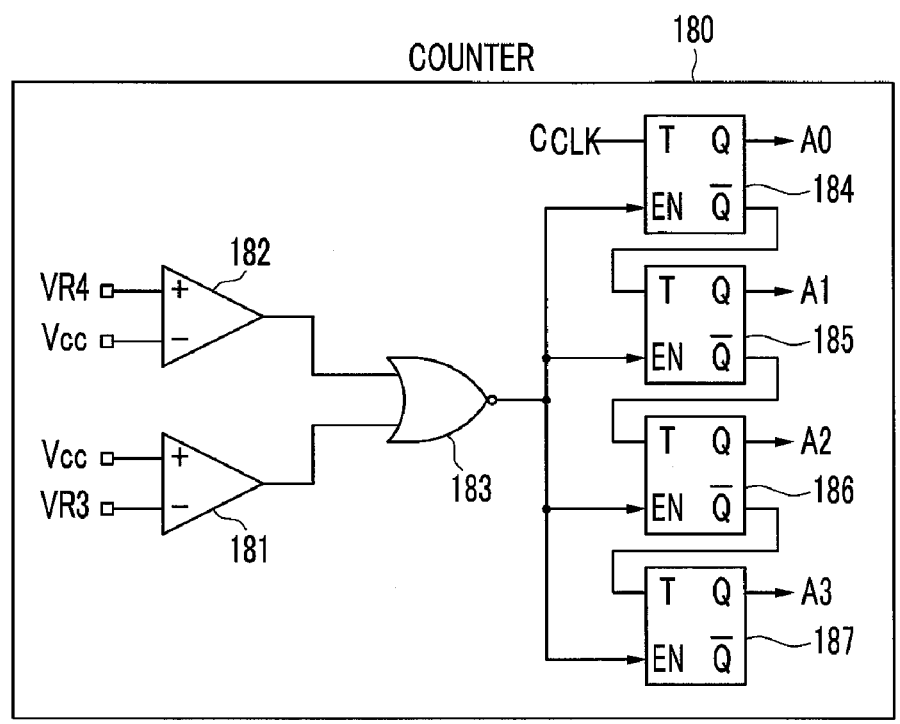
FIG. 2 is a diagram illustrating a configuration of a counter 180 according to an exemplary embodiment of the present invention.

FIG. 2 is a diagram illustrating a configuration of the counter 180 according to an exemplary embodiment of the present invention. As shown in FIG. 2, the counter 180 includes a first comparator 181, a second comparator 182, an arithmetic logic unit 183, and a plurality of counter flip-flops 184 to 187. In the exemplary embodiment of the present invention, the counter 180 includes four counter flip-flops 184 to 187, but the present invention is not limited thereto, and the number of counter flip-flops included in the counter 180 may vary depending on the number of compensation current sources 121 to 123 and the time when the plurality of compensation currents IF1 to IF3 start to flow. A reference voltage VR3 is inputted into an inversion terminal (−) of the first comparator 181 and the power supply voltage Vcc is inputted into a non-inversion terminal (+) of the first comparator 181. A reference voltage VR4 is inputted into a non-inversion terminal (+) of the second comparator 182 and the power supply voltage Vcc is inputted into an inversion terminal (−) of the second comparator 182.

Two input terminals of the arithmetic logic unit 183 are connected with output terminals of the first and second comparators 181 and 182, and an output terminal of the arithmetic logic unit 183 is connected to enable terminals EN of the four flip-flops 184 to 187 to thereby enable the four flip-flops 184 to 187. The arithmetic logic unit 183 according to the exemplary embodiment of the present invention is a NOR gate that outputs a high level when all input signals are at a low level. However, the present invention is not limited thereto, and the first comparator 181, the second comparator 182, and the arithmetic logic unit 183 may be designed so as to output a level to enable the four flip-flops 184 to 187 during a period when the power supply voltage Vcc is between the reference voltage VR4 and the reference voltage VR3.

The four counter flip-flops 184 to 187 each include an input terminal T, an output terminal Q, an inverted output terminal /Q, and an enable terminal EN. When the counter flip-flops according to the exemplary embodiment of the present invention are enabled, signals outputted through the output terminal Q and the inverted output terminal /Q are referred to as an output signal and an inverted output signal, respectively. The counter flip-flops are synchronized at the time when an input signal inputted into the input terminal T rises to invert the output signal and the inverted output signal. An output signal of the arithmetic logic unit 183 is inputted into an enable terminal EN of each of the four counter flip-flops 184 to 187. A counter clock CCLK is inputted into the input terminal T of the counter flip-flop 184 and a signal A0 is outputted through the output terminal Q. Herein, the counter clock CCLK may be the oscillator 132 of the PWM control unit 130. In the exemplary embodiment of the present invention, the counter flip-flop 184 generates a predetermined delay before generating the switching control signals A1 to A3. The signal A0 is not used as the switching control signal. However, the present invention is not limited thereto, and at least one counter flip-flop may be added between the counter flip-flop 184 and the counter flip-flop 185 to thereby increase the delay. The inverted output terminal /Q of the counter flip-flop 184 is connected to the input terminal T of the counter flip-flop 185. Accordingly, the counter flip-flop 185 is synchronized at the time when the inverted output signal of the counter flip-flop 184 rises to invert the output signal and the inverted output signal. The output signal of the counter flip-flop 185 is the switching control signal A1 of the switch Q1. The inverted output terminal /Q of the counter flip-flop 185 is connected to the input terminal T of the counter flip-flop 186. Accordingly, the counter flip-flop 186 is synchronized at the time when the inverted output signal of the counter flip-flop 185 rises to invert the output signal and the inverted output signal. The output signal of the counter flip-flop 186 is the switching control signal A2 of the switch Q2. The inverted output terminal /Q of the counter flip-flop 186 is connected to the input terminal T of the counter flip-flop 187. Accordingly, the counter flip-flop 187 is synchronized at the time when the inverted output signal of the counter flip-flop 186 rises to invert the output signal and the inverted output signal. The output signal of the counter flip-flop 187 is the switching control signal A3 of the switch Q3.

Hereinafter, referring to FIG. 3, an operation of the counter will be described in detail.

Figure 3:
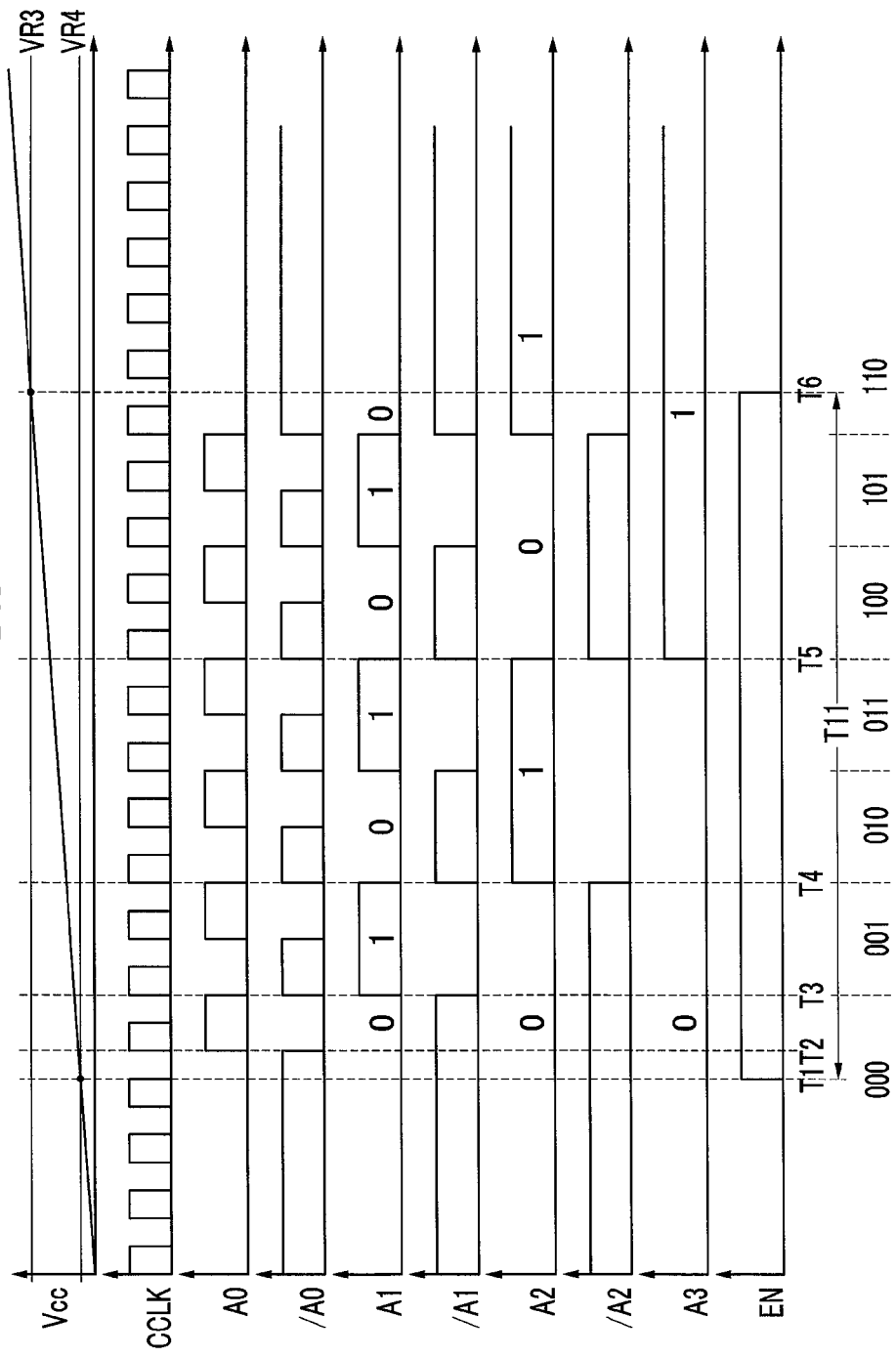
FIG. 3 is a diagram illustrating a power supply voltage Vcc and internal generated signals that are inputted into a counter according to an exemplary embodiment of the present invention.

FIG. 3 is a diagram illustrating a power supply voltage Vcc and internal generated signals that are inputted into a counter according to an exemplary embodiment of the present invention.

When the power supply voltage Vcc reaches the reference voltage VR4 at a time T1, an output signal of the second comparator 182 is at the low level. Since all output signals of the first comparator 181 and the second comparator 182 are at the low level, the arithmetic logic unit 183 outputs a high-level enable signal EN. All the counter flip-flops 184 to 187 are enabled by the high-level enable signal EN. After the counter flip-flop 184 is enabled, it is synchronized at a first rising time T2 of the counter clock signal CCLK to invert the output signal A0. In this case, the output signal A0 rises at the time T2. The counter flip-flop 184 is synchronized at the time T2 to invert an inverted output signal /A0, such that the inverted output signal /A0 falls at the time T2. The counter flip-flop 185 is synchronized at a rising time T3 of the inverted output signal /A0 to invert the switching control signal A1. In this case, the switching control signal A1 rises at the time T3. The counter flip-flop 185 is synchronized at the time T3 to invert the inverted switching control signal /A1, such that the inverted switching control signal /A1 falls at the time T3.

When the inverted output signal /A0 rises at a time T4, the inverted switching control signal /A1 rises. The counter flip-flop 186 is synchronized at the time T4 to invert the switching control signal A2. In this case, the switching control signal A2 rises at the time T4. The counter flip-flop 186 is synchronized at the time T4 to invert the inverted switching control signal /A2, such that the inverted switching control signal /A2 falls at the time T4.

When the inverted output signal /A0 rises at a time T5, the inverted switching control signal /A1 rises, such that the inverted switching control signal /A2 rises. In this case, the counter flip-flop 187 is synchronized at the time T5 to invert the switching control signal A3. Then, the switching control signal A3 rises at the time T5.

When the power supply voltage Vcc reaches the reference voltage VR3 at a time T6, the first comparator 181 outputs the high-level signal and the arithmetic logic unit 183 generates the low-level enable signal EN. In this case, all the counter flip-flops 184 to 187 maintain a present output state regardless of the signal inputted into the input terminal T. Since the switching control signals A2 and A3 are at the high level at the time T6, the compensation currents IF2 and IF3 of the compensation current sources 122 and 123 flow on the switches Q2 and Q3. In this case, the compensation feedback current IFC is determined by summing the compensation currents IF2 and IF3. Levels of the switching control signals A1 to A3 vary depending on a compensation period that it takes for the power supply voltage Vcc to increase from the reference voltage VR4 to the reference voltage VR3. Accordingly, the compensation feedback current IFC also varies. As the input voltage increases, a rising slope of the power supply voltage Vcc increases, such that the compensation period is shortened. On the contrary, as the input voltage decreases, the rising slope of the power supply voltage Vcc decreases, such that the compensation period is extended. As the compensation period increases, the counter 180 generates the switching control signals A1 to A3 so as to increase the compensation feedback current IFC. Assuming that high levels of the switching control signals A1 to A3 represent "1" and low levels of the switching control signals A1 to A3 represent "0", and the switching control signals are digital data in which the switching control signals are arranged in the order of A3, A2, and A1, as time elapses, the digital data increases in one cycle unit of the counter clock CCLK. As described above, since the order of the switching control signals is IF1<IF2<IF3, the switching control signal A3 represents a most significant bit, the switching control signal A2 represents a next significant bit, and the switching control signal A1 represents a least significant bit.

Accordingly, as the digital data A3, A2, and A1 increase in the order of 000, 001, 010, 011, 100, 101, 110, and 111, the compensation feedback current IFC increases.

A period in which the enable signal EN is at the high level is the same as the compensation period, and the switching control signals A1 to A3 are determined at a time when the compensation period is terminated. Thereafter, the switching control signals A1 to A3 are constantly maintained. As the compensation period increases, the compensation feedback current IFC increases, and as the compensation period decreases, the compensation feedback current IFC decreases. The compensation period is determined by the input voltage such that as the input voltage increases, the compensation feedback current IFC decreases, and as the input voltage decreases, the compensation feedback current IFC increases.

In the exemplary embodiment of the present invention, the reference voltages VR4 and VR3 are a starting voltage and a stopping voltage of the power supply voltage that determine a compensation period T11, respectively.

Further, the number of the plurality of compensation current sources and the magnitudes of the compensation currents of the plurality of compensation current sources may vary. Therefore, as the number of compensation current sources varies, the number of the plurality of counter flip-flops may vary. Further, a signal set as the switching control signal of the switch may also vary among the output signals of the plurality of counter flip-flops.

For example, when the reference voltage VR4 is lower than the reference voltage VR4 shown in FIG. 3, the compensation period is started earlier, such that the plurality of counter flip-flops are enabled earlier. That is, the compensation period increases. In this case, at least one compensation current source may be included. Therefore, the magnitude of the compensation current of each of the plurality of compensation current sources may vary. In order to use only three compensation current sources in spite of decreasing the reference voltage VR4, the number of counter flip-flops must be increased and the delay time must be increased by ignoring the output signal of the counter flip-flop having a high-level pulse at an initial compensation period.

When the reference voltage VR4 is set to a higher voltage than the reference voltage VR4 shown in FIG. 3, an enable time of the plurality of counter flip-flops is delayed and the compensation period decreases. In this case, the output signal of the first counter flip-flop 184 may be used as the switching control signal of the switch Q1, such that only three flip-flops may be used.

If the reference voltage VR3 is set to a lower voltage than the reference voltage VR3 shown in FIG. 3, this case may be described in the same manner as a case in which the reference voltage VR4 is set to the higher voltage, and if the reference voltage VR3 is set to a higher voltage than the reference voltage VR3 shown in FIG. 3, this case may be described in the same manner as a case in which the reference voltage VR4 is set to the lower voltage. In the exemplary embodiment of the present invention, the reference voltage VR3 is set to a lower voltage than the high reference voltage VR2. This is to include the compensation period in a period that it takes to increase the power supply voltage Vcc to the high-reference voltage VR2 in an initial operation.

Referring back to FIG. 1, the total feedback current IFB flows into the feedback circuit part 110 through the diode D11 and the resistors R1 and R2 through the diode D12. When the voltage of the feedback signal FB increases and reaches a predetermined value or more, the diode D11 is interrupted, such that the total feedback current IFB flows on only the resistors R1 and R2 through the diode D12. When the feedback signal FB has the predetermined value or less, the diode D11 is subjected to electrical conduction, and as the voltage of the feedback signal FB decreases, the capacitor Cfb is charged with a greater amount of current among the total feedback current. In this case, the voltage of the feedback signal FB increases. As such, the voltage of the feedback signal FB is controlled by the total feedback current IFB. When the diode D11 is interrupted, the capacitor Cfb is charged with the delay current Idelay. In the overload state, as the voltage of the capacitor Cfb increases, the voltage of the feedback signal FB may increase to the protection reference voltage VSD. In this case, the comparator 170 generates the protection signal PS for turning off the power switch M. The protection signal PS has the high level while the voltage of the feedback signal FB is equal to or more than the protection reference voltage VSD.

When the compensation feedback current IFC is determined during the compensation period T11, the total feedback current IFB is determined. That is, after the compensation period T11, the total feedback current IFB is constantly maintained. A maximum value of the power limit current Ilim is equal to the total feedback current IFB. Accordingly, the maximum value of the power limit current Ilim is determined depending on the compensation period T11. After the compensation period T11, the power limit current Ilim varies depending on the feedback signal FB. As the load decreases, the voltage of the feedback signal FB decreases, and as the load increases, the voltage of the feedback signal FB increases. When the feedback signal FB decreases, the current flowing through the diode D11 among the total feedback current IFB increases such that the power limit current Ilim decreases, and when the feedback signal FB increases, the current flowing on the diode D11 among the total feedback current IFB decreases such that the power limit current Him increases. Accordingly, as the load decreases, the power limit current Him decreases, and as the load increases, the power limit current Ilim increases. In the overload state, when the feedback signal FB increases and the diode D11 is interrupted, the power limit current Ilim is equal to the total feedback current IFB, which is the maximum value. At this time, since the drain current control voltage VA is acquired by multiplying the power limit current Ilim by the resistor R2, the drain current control voltage VA is proportional to the power limit current Ilim. Further, as the input voltage Vin increases, the total feedback current IFB decreases, and as the input voltage Vin decreases, the total feedback current IFB increases. Hereinafter, a relationship between the total feedback current IFB and the input voltage Vin is referred to as an inverse relationship. Accordingly, when the diode D11 is interrupted in the overload state, a value of the power limit current Ilim has an inverse relationship with the input voltage. Therefore, the drain current control voltage VA also has the inverse relationship with the input voltage Vin. In this case, the maximum output power is proportional to the drain current control voltage VA, such that as the input voltage Vin decreases, the drain current control voltage VA increases to thereby increase a maximum output power P1, and as the input voltage Vin increases, the drain current control voltage VA decreases to thereby decrease a maximum output power P2. Accordingly, the maximum output power P1 when the input voltage is low may be equal to the maximum output power P2 when the input voltage is high. If the power limit compensator 120 is not present, the maximum output power P2 is larger than the maximum output power P1.

As described above, in the case of the known SMPS, since the maximum value of the power limit current is constant, the maximum value of the drain current Ids flowing on the power switch M in the overload state is constant. In this case, the maximum output power varies depending on the input voltage. In the exemplary embodiment of the present invention, however, the maximum value of the power limit current is controlled to have the inverse relationship with the input voltage to thereby control the maximum value of the drain current control voltage. Consequently, the exemplary embodiment of the present invention controls the maximum output power constantly regardless of the input voltage.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A switch control device that controls a switching operation of a power switch for controlling an output power of a switching mode power supply (SMPS), the device comprising:
    an operation current source that generates an operation current corresponding to an input voltage of the SMPS; and
    a maximum output power control unit that counts a compensation period in which a power supply voltage generated by the operation current increases from a predetermined counter low-reference voltage to a predetermined counter high-reference voltage, generates a compensation feedback current depending on the count result, generates a total feedback current by summing a main feedback current having a predetermined value and the compensation feedback current, and generates a power limit current of which a maximum value increases and decreases depending on the total feedback current,
    wherein turn-off of the power switch is determined by comparing a current flowing on the power switch with the power limit current.

2. The switch control device of claim 1, wherein the maximum output power control unit comprises:
    a power limit compensator that counts the compensation period, and generates and outputs the compensation feedback current depending on the count result; and a feedback current source that generates the main feedback current, wherein the power limit current is determined depending on a feedback signal corresponding to an output voltage of the SMPS among the total feedback current, and the power limit current includes the total feedback current in an overload state of the SMPS.

3. The switch control device of claim 2, wherein the power limit compensator comprises:

at least one compensation current source that generates at least one compensation current;

at least one switch that is connected between the at least one compensation current source and the feedback current source; and a counter that counts the compensation period and controls a switching operation of the at least one switch depending on the count result.

4. The switch control device of claim 3, wherein the counter comprises:

a first comparator that compares the counter high-reference voltage with the power supply voltage;

a second comparator that compares the counter low-reference voltage with the power supply voltage;

an arithmetic logic unit that receives and logically operates comparison results of the first comparator and the second comparator and outputs an enable signal depending on the logic operation results; and at least one counter flip-lop that is enabled depending on the enable signal, and inverts and outputs an output signal and an inverted output signal at one cycle of an input signal, wherein the enable signal corresponds to the compensation period and the output signal of the at least one counter flip-flop is a switching control signal of the at least one switch.

5. The switch control device of claim 4, wherein the first comparator comprises:

a non-inversion terminal that receives the power supply voltage and an inversion terminal that receives the counter high-reference voltage, the second comparator includes an inversion terminal that receives the power supply voltage and a non-inversion terminal that receives the counter low-reference voltage, and the arithmetic logic unit is a NOR gate.

6. The switch control device of claim 4, wherein the number of the at least one compensation current source is the same as the number of the at least one switch, and the number of the at least one counter flip-flop is determined depending on the number of the at least one switch.

7. The switch control device of claim 6, wherein the number of the at least one compensation current source or the number of the at least one switch is n, and the at least one counter flip-flop includes n counter flip-flops corresponding to n switches, respectively.

8. The switch control device of claim 7, wherein an inverted output signal of a k-th (where k is a natural number of 1 to n−1) counter flip-flop among the n counter flip-flops is an input signal of a (k+1)-th counter flip-flop and an output signal of the k-th counter flip-flop is a switching control signal of a k-th switch among the n switches.

9. The switch control device of claim 8, wherein an output signal of the (k+1)-th counter flip-flop is a switching control signal of a (k+1)-th switch among the n switches.

10. The switch control device of claim 8, wherein the at least one counter flip-flop comprises a counter flip-flop that receives a counter clock signal having a predetermined cycle as the input signal, wherein digital data realized by the output signal of the at least one counter flip-flop increase at one cycle of the counter clock signal.

11. The switch control device of claim 2, wherein the maximum output power control unit further comprises:

a first diode that receives the feedback signal through a cathode electrode thereof and is connected to the feedback current source and an output terminal of the power limit compensator;

a second diode of which an anode electrode is connected to the feedback current source and the output terminal of the power limit compensator;

a first resistor of which one side is connected to a cathode electrode of the second diode; and a second resistor of which one side is connected to the other side of the first resistor and the other side is grounded, wherein the feedback signal increases when an output voltage of the SMPS decreases and decreases when the output voltage of the SMPS increases, and the power limit current flows through the second diode.

12. The switch control device of claim 11, further comprising a PWM control unit that determines a turn-off time of the power switch by comparing a sensing voltage corresponding to the current flowing on the power switch with a drain current control voltage that is generated by flowing the power limit current on the second resistor.

13. The switch control device of claim 12, wherein the PWM control unit turns off the power switch when the sensing voltage reaches the drain current control voltage.

14. The switch control device of claim 1, further comprising a switch that charges a capacitor by using the operation current source to generate the power supply voltage and is positioned between the capacitor and the operation current source, wherein when the power supply voltage is equal to or more than a high reference voltage that is larger than an operation threshold voltage required to operate the switch control device by a predetermined margin in an initial operation, the switch is turned off.

15. The switch control device of claim 14, further comprising a hysteresis comparator that compares the power supply voltage with the high reference voltage and a low reference voltage that is lower than the high reference voltage and controls the switching operation of the switch depending on the comparison result, wherein the hysteresis comparator turns on the switch when the power supply voltage is smaller than the low reference voltage and maintains the present switch state when the power supply voltage is between the low reference voltage and the high reference voltage.

16. A switch control method of controlling a switching operation of a power switch that controls an output power of a switching mode power supply (SMPS), the method comprising the steps of:

generating an operation current corresponding to an input voltage of the SMPS;

counting a compensation period in which a power supply voltage generated by the operation current increases from a predetermined counter low-reference voltage to a predetermined counter high-reference voltage;

generating a compensation feedback current depending on the count result in the counting step;

generating a total feedback current by summing a main feedback current having a predetermined value and the compensation feedback current; and determining turn-off of the power switch by comparing the current flowing on the power switch with a power limit current of which a maximum value is determined depending on the total feedback current.

17. The switch control method of claim 16, further comprising determining the power limit current depending on a feedback signal corresponding to an output voltage of the SMPS among the total feedback current, wherein the power limit current includes the total feedback current in an overload state of the SMPS.

18. The switch control method of claim 17, wherein, in the determining of the power limit current, the power limit current increases when the feedback signal increases and the power limit current decreases when the feedback signal decreases, and the feedback signal increases when the output voltage of the SMPS decreases and decreases when the output voltage of the SMPS increases.

19. The switch control method of claim 16, wherein the generating of the compensation feedback current comprises counting the compensation period and increasing the compensation feedback current depending on the count result.

20. The switch control method of claim 16, further comprising generating a power supply voltage by charging a capacitor by using the operation current source, wherein, when the power supply voltage is equal to or larger than a high reference voltage that is larger than an operation threshold voltage that is required to operate the switch control device in an initial operation by a predetermined margin, charging of the capacitor is stopped.

* * * * *